(12) United States Patent
Kraeuter et al.

(10) Patent No.: US 8,194,326 B2
(45) Date of Patent: Jun. 5, 2012

(54) OPTICAL DEVICE, METHOD OF PRODUCING THE DEVICE AND OPTOELECTRONIC COMPONENT COMPRISING THE DEVICE

(75) Inventors: Gertrud Kraeuter, Regensburg (DE); Torsten Pietzonka, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 101 days.

(21) Appl. No.: 12/676,266

(22) PCT Filed: Aug. 14, 2008

(86) PCT No.: PCT/DE2008/001353
§ 371 (c)(1),
(2), (4) Date: Apr. 20, 2010

(87) PCT Pub. No.: WO2009/030193
PCT Pub. Date: Mar. 12, 2009

(65) Prior Publication Data
US 2010/0220396 A1    Sep. 2, 2010

(30) Foreign Application Priority Data

Sep. 4, 2007 (DE) .................. 10 2007 041 889
Oct. 31, 2007 (DE) .................. 10 2007 052 133

(51) Int. Cl.
*G02B 1/00* (2006.01)
(52) U.S. Cl. ...................................................... 359/642
(58) Field of Classification Search ........... 359/642–895
See application file for complete search history.

(56) References Cited

U.S. PATENT DOCUMENTS

| 4,125,319 A * | 11/1978 | Frank et al. .................. 359/296 |
| 6,183,872 B1 * | 2/2001 | Tanaka et al. ................. 428/429 |
| 6,991,826 B2 | 1/2006 | Pellerite et al. |
| 2005/0233070 A1 | 10/2005 | Pellerite et al. |
| 2006/0220532 A1 | 10/2006 | Tanabe et al. |

FOREIGN PATENT DOCUMENTS

| DE | 10 2004 019 973 A1 | 9/2005 |
| EP | 1 708 294 A2 | 10/2006 |
| WO | WO-03/076512 A1 | 9/2003 |

* cited by examiner

*Primary Examiner* — Darryl J Collins
(74) *Attorney, Agent, or Firm* — Slater & Matsil, L.L.P.

(57) ABSTRACT

An optical device having a specific form is provided that includes a resin molding compound having an adhesion-reducing, chemically modified surface layer.

18 Claims, 3 Drawing Sheets

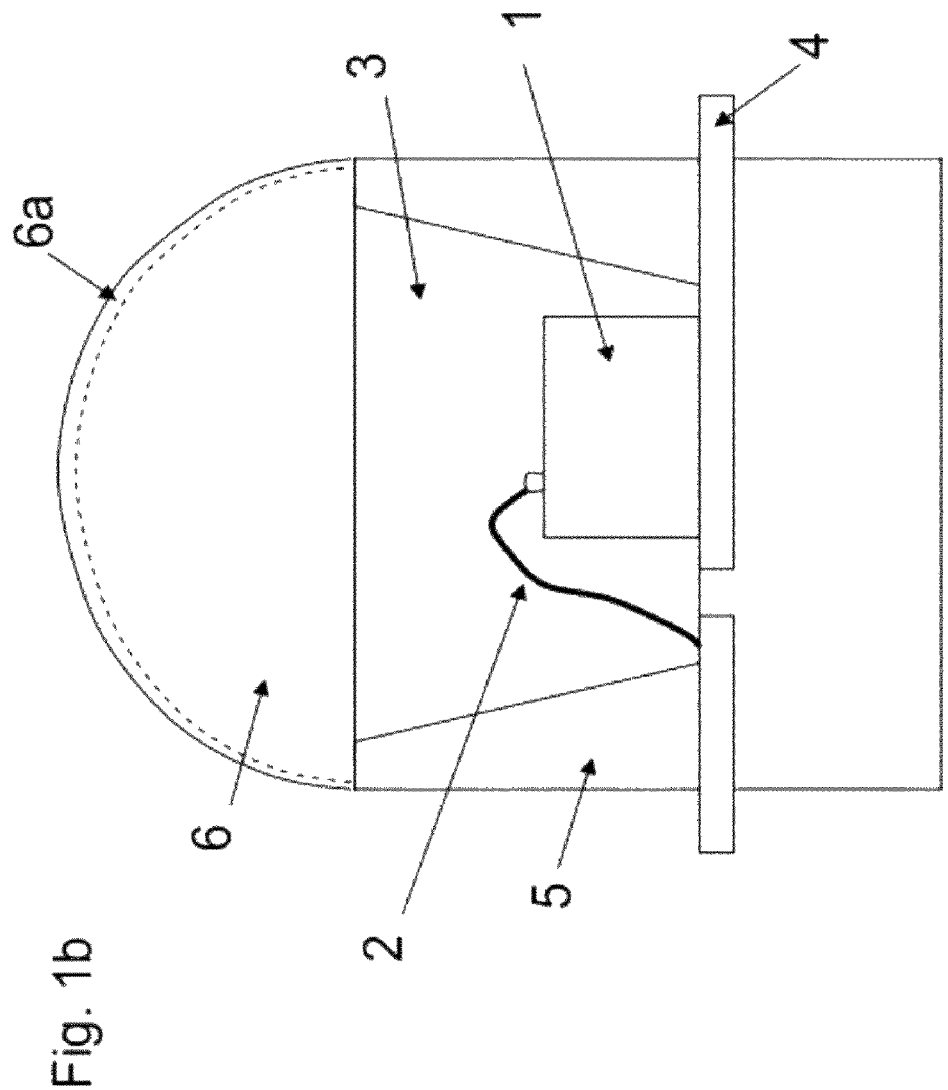

OPTICAL DEVICE, METHOD OF PRODUCING THE DEVICE AND OPTOELECTRONIC COMPONENT COMPRISING THE DEVICE

This patent application is a national phase filing under section 371 of PCT/DE2008/001353, filed Aug. 14, 2008, which claims the priority of German patent applications 10 2007 041 889.4, filed Sep. 4, 2007 and 10 2007 052 133.4, filed Oct. 31, 2007, each of which is incorporated herein by reference in its entirety.

TECHNICAL FIELD

The invention relates to an optical device having a specific form, to a method of producing it and to an optoelectronic component that includes such a device.

BACKGROUND

In optoelectronic components there may be optical devices which have tacky surfaces. Such surfaces result in contaminants or particles, such as dust, for example, attaching to them, or in the devices themselves attaching to other devices. Such attachments may lead to quality problems.

SUMMARY

In one aspect, the invention provides an optical device which is improved in respect of the disadvantages identified above.

According to one embodiment of the invention an optical device having a specific form including a resin molding compound which has an adhesion-reducing surface layer. The adhesion-reducing surface layer is chemically modified. An optical device of this kind thus reduces instances of contamination as a result of particle attachments.

The device may be formed of the same resin molding compound as the surface layer, the resin molding compound of the surface layer being chemically modified. Hence it is not necessary to arrange an additional layer on the device, but instead only to produce the surface layer of the resin molding compound by means of chemical modification. As a chemical modification the surface layer may be fluorinated. The optical device may, for example, be adhesion-reducing for dust particles.

An optical device is able to interact with light and thereby to be optically active or optically manipulating. Hence an optical device may be light-shaping, light-guiding or light-converting in its action. An optical device may exhibit its optical effect, for example, in the form of scattering, refracting, reflecting, diverting and diffracting.

The optical device may be transparent or reflecting for radiation. As a result it can be used in optoelectronic components. In such components a transparent device may be disposed in the beam path of emitted or received radiation.

The device may be formed as a potting or as a lens. As a result it is suitable for use as an optical device in, for example, optoelectronic components. If the device is formed as a potting, it can be used, for example, as potting for semiconductor layer sequences. Lenses which have a resin molding compound including the adhesion-reducing surface layer are particularly temperature-stable and radiation-stable and are transparent for the emitted and received radiation.

The resin molding compound which is present in the optical device may have a material selected from the group which encompasses silicone resin, epoxy resin and hybrid resin that has silicone groups and/or epoxy groups. These materials are transparent and are suitable for forming as potting or lenses.

Further provided is a method of producing an optical device having the properties described above. Such a method encompasses the steps of A) providing the resin molding compound, B) forming the resin molding compound into the optical device, and C) producing an adhesion-reducing surface layer of the resin molding compound from the optical device. This method can be implemented purposively and relatively simply.

In the course of the method it is possible in step A) to provide a resin molding compound which is selected from a group that encompasses silicone resins, epoxy resins and hybrid resins that contain silicone and/or epoxy groups. In step B) of the method the resin molding compound may be formed as a lens or as potting. For the forming it is possible, for example, to use an injection molding process or casting. By this means the desired form of the device can be produced purposively.

In step C) of the method it is possible to modify the surface layer of the resin molding compound chemically for the purpose of producing the adhesion-reducing surface layer. For the chemical modification in step C) of the method it is possible to expose the resin molding compound to a plasma. The plasma may include fluorine-containing compounds which may be selected from a group that includes $CF_4$, $C_2F_6$, $NF_3$ and $SF_6$. These compounds contain fluorine, which serves to fluorinate the silicone resin or the epoxy resin. By way of example, the carbon atoms present in the resin molding compound may be fluorinated. This produces Teflon-like compounds which form a thin layer with a thickness of less than 50 nm on the surface of the resin molding compound. The plasma containing the fluorine-containing compounds may additionally include an inert gas, such as argon, for example, and may therefore, when required, dilute the fluorine-containing compounds. The ratio of argon to the fluorine-containing compounds can in this case be between 1:9 and 9:1. The resin molding compound can be exposed to the plasma for 1 to 30 minutes, preferably for 5 to 30 minutes. This may take place at room temperature, in which case the resin molding compound may heat up to up to 40° C. to 50° C. during treatment with the plasma. The plasma may include a low-pressure plasma, so that the resin molding compound is exposed to the plasma at a pressure of approximately 0.1 mbar.

A further possibility is for the fluorine-containing compounds to polymerize during plasma treatment and to be deposited as an additional layer on the modified surface layer of the resin molding compound. The additional layer may be Teflon-like and may have a thickness of less than 50 nm.

Further provided is an optoelectronic component having a radiation-emitting or radiation-receiving semiconductor layer sequence, and an optical device having the properties described above. In this case the optical device is arranged in the beam path of the emitted or received radiation. The optoelectronic component may include an optical device shaped as a lens. It may further include an optical device which is shaped as a potting. The optoelectronic component may include a semiconductor layer sequence, the potting encapsulating the semiconductor layer sequence. The semiconductor layer sequence may be, for example, a light-emitting diode (LED).

BRIEF DESCRIPTION OF THE DRAWINGS

The invention is intended to be elucidated in greater detail by reference to the figures:

FIG. 1b shows a schematic side view of another embodiment of the optoelectronic component with the optical device.

The following list of reference symbols may be used in conjunction with the drawings:

1 Semiconductor layer sequence
2 Bond wire
3 Potting
3a Surface layer
4 Conductor strip
5 Housing
6 Lens
6a Surface layer

DETAILED DESCRIPTION OF ILLUSTRATIVE EMBODIMENTS

Figure 1A:
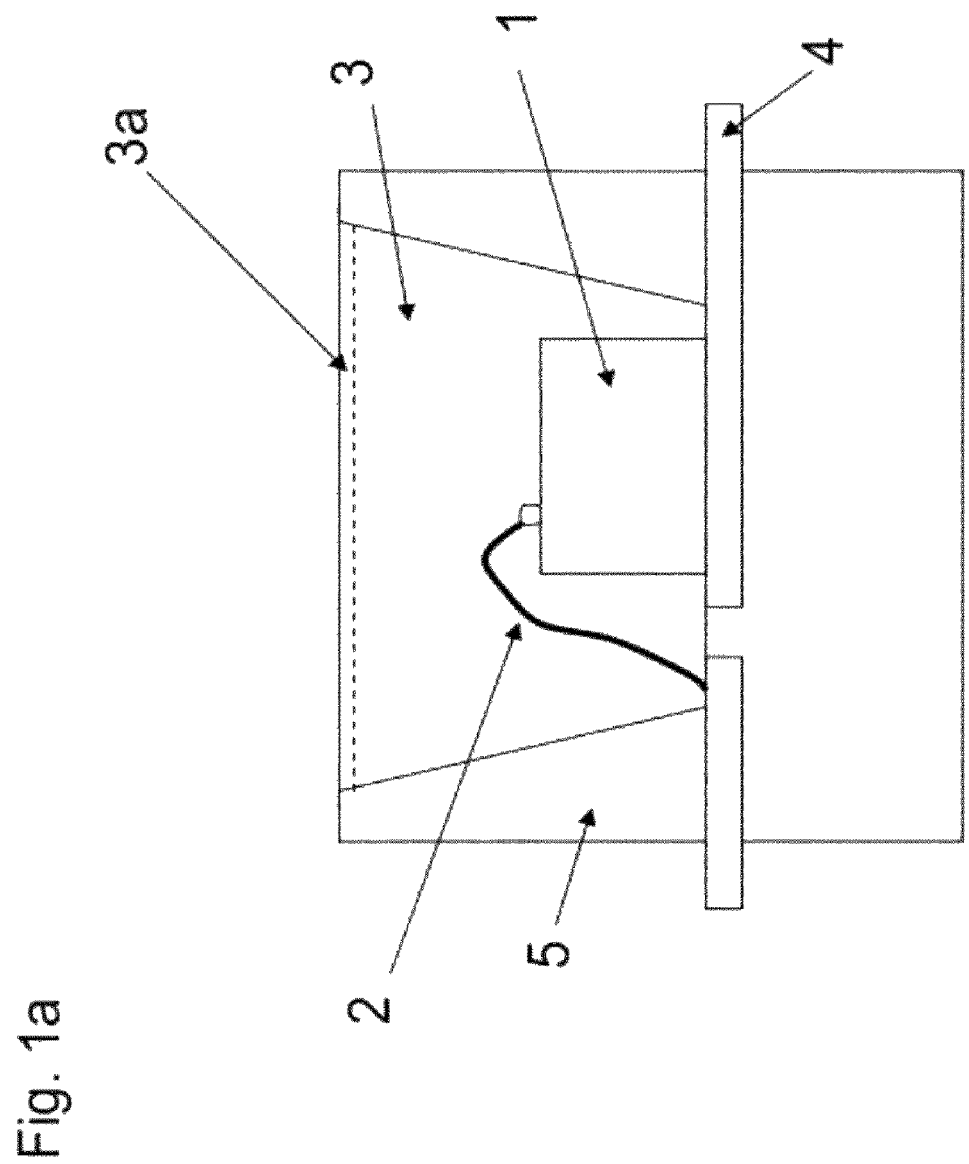
FIG. 1a shows a schematic side view of one embodiment of the optoelectronic component with the optical device.

FIG. 1a shows the schematic side view of an optoelectronic component. This component includes a semiconductor layer sequence 1, which may be, for example, an LED, and is contacted electronically both directly and via a bond wire 2 to a respective conductor strip 4. The semiconductor layer sequence 1 and also the bond wire 2 are surrounded by the potting 3, which is located in the housing 5. The housing 5 may have beveled side faces, serving for enhanced reflection of the radiation emitted. The potting 3 may be formed of a resin molding compound that includes epoxy resins, silicone resins and hybrid resins that have silicone groups and/or epoxy groups, and has been treated with a plasma that includes, for example, fluorine-containing compounds, so that it has a surface layer 3a which is adhesion-reducing for contaminants such as, for example, dust particles.

On the housing 5 and the potting 3 there may be a lens 6, as is shown in FIG. 1b. The lens 6 may have a resin molding compound that includes epoxy resins and silicone resins. The resin molding compound formed as a lens may also have been treated by a method, by exposing the lens to a plasma with, for example, fluorine-containing compounds. Accordingly the lens 6 as well has an adhesion-reducing surface layer 6a which has fluorinated compounds and is adhesion-reducing for contaminants such as dust, for example.

Figure 2:
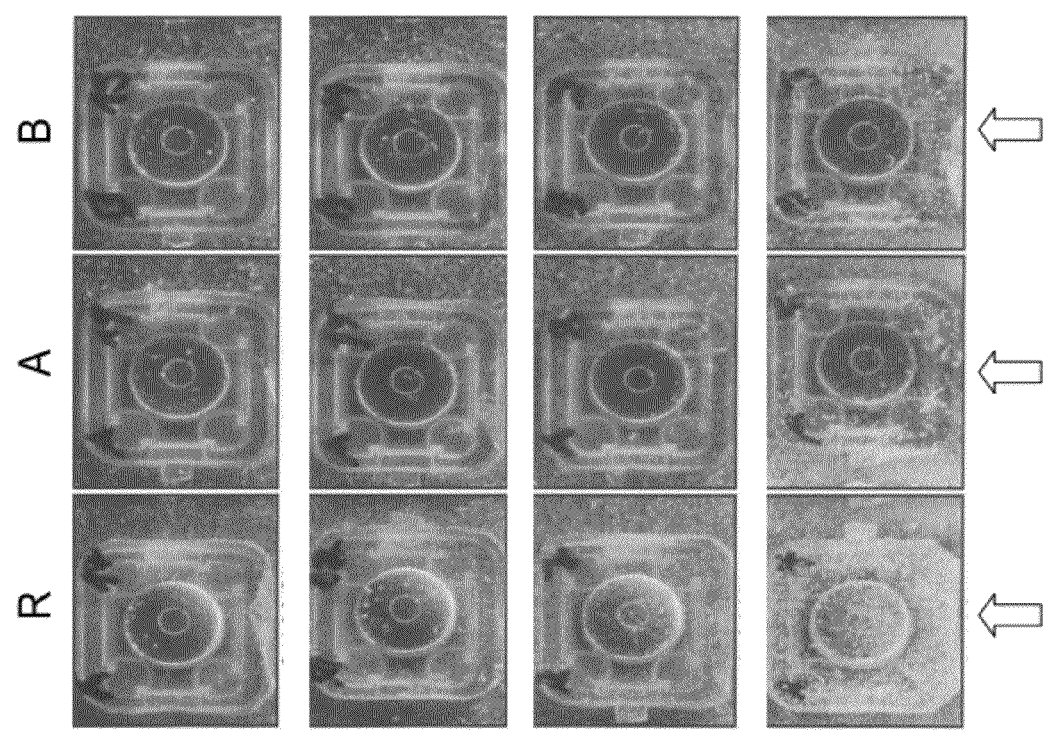
FIG. 2 shows photographs of optical devices which have been exposed to contaminants.

FIG. 2 shows photographs of lenses which have been formed from a resin molding compound and have not yet been assembled onto optoelectronic components. The lenses have been applied adjacently on a holder. The arrangement of the individual photographs in FIG. 2 corresponds to the arrangement of the lenses on the holder. The lenses in the first column, R, are silicone resin lenses which have an untreated surface. The lenses of the second column A and of the third column B are silicone resin lenses from two production batches which have been treated in accordance with the method described above using a $CF_4$ plasma and which therefore have adhesion-reducing surface layers. From the bottom, the lenses have been dusted with fine dust particles, including glass fiber cloth encased in epoxy resin, and indicated in FIG. 2 by means of arrows. In the bottom most row, therefore, there is fine dust at most on the lenses, in all of the columns, and it goes down as the distance from the dust source increases, in other words in the upper rows. In column R, with the lenses that have an untreated surface, however, a much higher dust concentration is apparent (white areas) than in rows A and B with the treated lenses. Accordingly it is possible to show that the treatment of the surfaces of the lenses leads to an adhesion-reducing surface layer and hence to devices that are less susceptible to instances of contamination.

The examples and embodiments shown in FIGS. 1a, 1b and 2 can be varied arbitrarily. It should also be borne in mind that the invention is not restricted to these examples, but instead admits further embodiments not depicted here.

The invention claimed is:

1. An optical device, comprising a resin molding compound which has a chemically modified, adhesion-reducing surface layer, wherein the surface layer is formed of the same resin molding compound as the device, the resin molding compound of the surface layer being chemically modified.

2. The device according to claim 1, wherein the surface layer comprises a fluorinated layer.

3. The device according to claim 1, wherein the surface layer is adhesion-reducing for dust particles.

4. The device according to claim 1, wherein the device is transparent or reflecting for radiation.

5. The device according to claim 1, wherein the molding compound comprises a potting material.

6. The device according to claim 1, wherein the molding compound forms a lens.

7. The device according to claim 1, wherein the resin molding compound comprises a material selected from the group consisting of silicone resin, epoxy resin and hybrid resin that has silicone groups and/or epoxy groups.

8. A method of producing an optical device, the method comprising:
    providing a resin molding compound;
    forming the resin molding compound into an optical device; and
    producing an adhesion-reducing surface layer on the optical device, wherein the surface layer is formed of the same resin molding compound as the device, and wherein producing the adhesion-reducing surface layer comprises chemically modifying the surface layer of the resin molding compound.

9. The method according to claim 8, wherein forming the resin molding compound into an optical device comprises forming a lens.

10. The method according to claim 8, wherein chemically modifying the resin molding compound comprises exposing the surface layer to a plasma that comprises fluorine-containing compounds.

11. An optoelectronic component comprising:
    a radiation-emitting or radiation-receiving semiconductor layer sequence; and
    an optical device located in a beam path of the radiation-emitting or radiation-receiving semiconductor layer sequence, the optical device comprising a resin molding compound which has a chemically modified, adhesion-reducing surface layer, wherein the optical device comprises a potting.

12. The optoelectronic component according to claim 11, wherein the surface layer comprises a fluorinated surface layer.

13. The optoelectronic component according to claim 11, wherein the resin molding compound comprises a material selected from the group consisting of silicone resin, epoxy resin and hybrid resin that has silicone groups and/or epoxy groups.

14. The optoelectronic component according to claim 11, wherein the radiation-emitting or radiation-receiving semiconductor layer sequence comprises a radiation-emitting semiconductor layer sequence.

15. The optoelectronic component according to claim 11, wherein the radiation-emitting or radiation-receiving semiconductor layer sequence comprises a radiation-receiving semiconductor layer sequence.

16. A method of producing an optical device, the method comprising:
   providing a resin molding compound;
   forming the resin molding compound into an optical device, wherein forming the resin molding compound into an optical device comprises forming a potting; and
   producing an adhesion-reducing surface layer of the resin molding compound on the optical device.

17. An optical device, comprising a resin molding compound which has a chemically modified, adhesion-reducing surface layer, wherein the molding compound comprises a potting material.

18. A method of producing an optical device, the method comprising:
   providing a resin molding compound;
   forming the resin molding compound into an optical device; and
   producing an adhesion-reducing surface layer on the optical device, wherein producing the adhesion-reducing surface layer comprises chemically modifying the surface layer of the resin molding compound, and wherein chemically modifying the resin molding compound comprises exposing the surface layer to a plasma that comprises fluorine-containing compounds.

* * * * *